(12) United States Patent
Shimomura et al.

(10) Patent No.: US 7,579,893 B2
(45) Date of Patent: *Aug. 25, 2009

(54) MUTE CIRCUIT

(75) Inventors: Kazuhiro Shimomura, Osaka (JP); Makoto Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/099,500

(22) Filed: Apr. 8, 2008

(65) Prior Publication Data

US 2008/0211565 A1    Sep. 4, 2008

Related U.S. Application Data

(62) Division of application No. 11/492,120, filed on Jul. 25, 2006, now Pat. No. 7,372,325.

(30) Foreign Application Priority Data

Sep. 29, 2005  (JP) .............................. 2005-283152

(51) Int. Cl.
H03L 5/00 (2006.01)

(52) U.S. Cl. ..................... 327/309; 327/312; 327/537

(58) Field of Classification Search ................. 327/309, 327/310, 312, 323, 534, 537; 330/51, 307; 381/94.5, 94.8
See application file for complete search history.

(56) References Cited

U.S. PATENT DOCUMENTS

| 5,300,892 A | 4/1994 | Hirai ............................ 330/51 |
| 6,734,746 B1 | 5/2004 | Nogi ............................ 331/81 |
| 7,372,325 B2 * | 5/2008 | Shimomura et al. ........... 330/51 |
| 2007/0009110 A1 * | 1/2007 | Kakumoto et al. .......... 381/104 |

FOREIGN PATENT DOCUMENTS

| JP | 2002-111446 | 4/2002 |
| JP | 2002271217 A * | 9/2002 |
| JP | 2004-320490 | 11/2004 |

* cited by examiner

*Primary Examiner*—Long Nguyen
(74) *Attorney, Agent, or Firm*—Steptoe & Johnson LLP

(57) ABSTRACT

An NchMOS transistor (1) is provided for muting of an output terminal (10) to which positive and negative output signals are outputted, and a mute switch circuit (3) is provided for controlling on/off of the transistor (1) by switching a voltage applied to the gate of the transistor (1). When muting is turned off, the back gate of the transistor (1) is biased by resistance division between resistors (R1 and R2) connected in series between the output terminal (10) and a predetermined negative potential (VSS).

3 Claims, 4 Drawing Sheets

MUTE CIRCUIT

This is a divisional of application Ser. No. 11/492,120, filed Jul. 25, 2006, now U.S. Pat. No. 7,372,325.

FIELD OF THE INVENTION

The present invention relates to a mute circuit in an input/output interface and particularly relates to a mute circuit using a MOS transistor as a switching device.

BACKGROUND OF THE INVENTION

In recent years, techniques have been proposed in which MOS transistors are used for muting input and output in the input/output interfaces of audio amplifiers or the like to which positive and negative signals are outputted.

However, when a MOS transistor for muting is turned off, input/output signals largely fluctuating to the negative side may turn on a parasitic diode between the back gate and the drain or source of the MOS transistor. Thus the input/output signals are clamped and distortion occurs on the signals.

In order to avoid the clamping of input/output signals, Japanese Patent Laid-Open No. 2002-111446 proposes a known technique of applying a negative voltage to the back gate of a MOS transistor.

A mute circuit disclosed in Japanese Patent Laid-Open No. 2002-111446 comprises an amplifier and an Nch (channel) MOS transistor for muting.

The amplifier has an input connected to an input terminal and an output connected to an output terminal via a first resistor, and the amplifier outputs positive and negative signals in a state in which the center level of the output signal is set at the ground potential. The NchMOS transistor has a drain connected to a junction point between the first resistor and the output terminal and a source connected to the ground potential. A second resistor is connected between the gate and the back gate of the transistor. In this mute circuit, a parasitic diode appears between the drain and the back gate of the NchMOS transistor.

In this configuration, a power supply potential is applied to the gate of the NchMOS transistor and the back gate of the NchMOS transistor through the second resistor to turn on the NchMOS transistor. At this time, a signal inputted to the input terminal is muted on the output of the amplifier in accordance with the ratio between the first resistor and the ON resistance of the NchMOS transistor. Further, a negative potential equivalent to the power supply potential is applied to the gate of the NchMOS transistor and the back gate of the NchMOS transistor through the second resistor to turn off the NchMOS transistor. At this time, the signal having been inputted to the input terminal is driven by the amplifier without being muted, and then is outputted to the output terminal. The negative potential is applied to the back gate of the NchMOS transistor when muting is turned off, and the output signal does not fall below the back gate voltage of the NchMOS transistor when the output signal is outputted to the negative side. Thus the parasitic diode between the drain and the back gate of the NchMOS transistor is not turned on, so that the output signal is not clamped when muting is turned off, preventing distortion on the output signal.

However, when muting is turned off in this known mute circuit, the output signal outputted to the maximum to the positive side may maximize a voltage difference between the drain and the back gate of the NchMOS transistor and the voltage difference may be equal to a voltage difference between the power supply potential and the negative potential. For this reason, the breakdown voltage of the NchMOS transistor has to be equal to or higher than the voltage difference between the power supply potential and the negative potential. For example, when the power supply potential is 3 V and the negative potential is (−3) V, the maximum voltage of about 6 V may be applied between the drain and the back gate of the NchMOS transistor when muting is turned off, so that the NchMOS transistor for muting requires the breakdown voltage of 6 V or higher. Conversely, when the breakdown voltage of the NchMOS transistor is 6 V or higher, the power supply potential is limited within 3 V and the negative potential is limited within (−3) V. In this way, the power supply voltage range on the positive side and the negative side is limited within one half of the breakdown voltage of the NchMOS transistor for muting.

DISCLOSURE OF THE INVENTION

In order to solve these problems, it is an object of the present invention to provide a mute circuit in which an MOS transistor for muting is used in an input/output interface to prevent the clamping of input/output signals and expand the power supply voltage range limited by the breakdown voltage of the MOS transistor for muting.

In order to attain the object, the present invention is a mute circuit for muting positive and negative output signals outputted to an output terminal, the mute circuit comprising: an NchMOS transistor having a drain connected to the output terminal and a source connected to a ground potential, a mute switch circuit for controlling on/off of the NchMOS transistor by switching a gate voltage of the NchMOS transistor to a power supply potential or a negative potential, and first and second resistors connected in series at a resistance ratio of about 1:1, wherein one end of the series resistors is connected to the output terminal, a junction point between the first resistor and the second resistor is connected to the back gate of the NchMOS transistor, and the other end of the series resistors is connected to the negative potential.

With this configuration, when the mute switch circuit applies the negative potential to the gate of the NchMOS transistor and the NchMOS transistor is turned off, the output terminal is not short-circuited to the ground potential. Thus the output signal is not muted but outputted to the output terminal. When muting is turned off, the back gate of the NchMOS transistor is biased by resistance division between the first and second resistors which are connected between the output terminal and the negative potential. Thus the back gate voltage of the NchMOS transistor changes with the output signal and does not exceeds the output signal. For this reason, a parasitic diode between the drain and the back gate of the NchMOS transistor is not turned on, preventing the clamping of the output signal when muting is turned off.

Further, the present invention is a mute circuit for muting positive and negative output signals outputted to an output terminal, the mute circuit comprising: an NchMOS transistor having a drain connected to the output terminal and a source connected to a ground potential, a mute switch circuit for controlling on/off of the NchMOS transistor by switching a gate voltage of the NchMOS transistor to a power supply potential or a negative potential, a resistor having one end connected to the output terminal, and a predetermined number of diodes connected in series in the forward direction, wherein a junction point between the other end of the resistor and the anode side of the diodes is connected to the back gate of the NchMOS transistor, and the cathode side of the diodes is connected to the negative potential.

With this configuration, when the mute switch circuit applies the negative potential to the gate of the NchMOS transistor and the NchMOS transistor is turned off, the output terminal is not short-circuited to the ground potential. Thus the output signal is not muted but outputted to the output terminal. When muting is turned off, in the case of an output signal outputted to the positive side, the back gate voltage of the NchMOS transistor is limited by turning on all the predetermined number of diodes, and the back gate voltage is equal to the sum of voltages at which the diodes are turned on. In the case of an output signal outputted to the negative side, the voltage is not limited by the predetermined number of diodes and thus changes like the output signal. Therefore, the back gate voltage of the NchMOS transistor does not exceed the output signal, so that a parasitic diode between the drain and the back gate of the NchMOS transistor is not turned on, preventing the clamping of the output signal when muting is turned off.

Moreover, the present invention is a mute circuit for muting positive and negative output signals outputted to an output terminal, the mute circuit comprising: a PchMOS transistor having a source connected to the output terminal and a drain connected to a ground potential, a mute switch circuit for controlling on/off of the PchMOS transistor by switching a voltage applied to the gate of the PchMOS transistor to a power supply potential or a negative potential, and first and second resistors connected in series at a resistance ratio of about 1:1, wherein one end of the series resistors is connected to the power supply potential, a junction point between the first resistor and the second resistor is connected to the back gate of the PchMOS transistor, and the other end of the series resistors is connected to the output terminal.

With this configuration, when the mute switch circuit applies the power supply potential to the gate of the PchMOS transistor and the PchMOS transistor is turned off, the output terminal is not short-circuited to the ground potential. Thus the output signal is not muted but outputted to the output terminal. When muting is turned off, the back gate of the PchMOS transistor is biased by resistance division between the first and second resistors which are connected between the power supply potential and the output terminal. Thus the back gate voltage of the PchMOS transistor changes with the output signal and does not fall below the output signal. For this reason, a parasitic diode between the source and the back gate of the PchMOS transistor is not turned on, preventing the clamping of the output signal when muting is turned off.

Further, the present invention is a mute circuit for muting positive and negative input signals inputted to an input terminal, the mute circuit comprising: a first resistor having one end connected to the input terminal, an NchMOS transistor having a drain connected to the other end of the first resistor and a source connected to a ground potential, a mute switch circuit for controlling on/off of the NchMOS transistor by switching a gate voltage of the NchMOS transistor to a power supply potential or a negative potential, and second and third resistors connected in series at a resistance ratio of about 1:1, wherein one end of the series resistors is connected to the drain of the NchMOS transistor, a junction point between the second resistor and the third resistor is connected to the back gate of the NchMOS transistor, and the other end of the series resistors is connected to the negative potential.

With this configuration, when the mute switch circuit applies the negative potential to the gate of the NchMOS transistor and the NchMOS transistor is turned off, the input terminal is not short-circuited to the ground potential. Thus the input signal is not muted but outputted as it is. When muting is turned off, the back gate voltage of the NchMOS transistor is biased by resistance division between the second and third resistors which are connected in series between the negative potential and drain of the NchMOS transistor at a resistance ratio of about 1:1. Thus the back gate voltage of the NchMOS transistor changes with the input signal and does not exceed the input signal. For this reason, a parasitic diode between the drain and the back gate of the NchMOS transistor is not turned on, preventing the clamping of the input signal when muting is turned off.

DESCRIPTION OF THE EMBODIMENTS

The following will describe embodiments of the present invention in accordance with the accompanying drawings.

Embodiment 1

Figure 1:
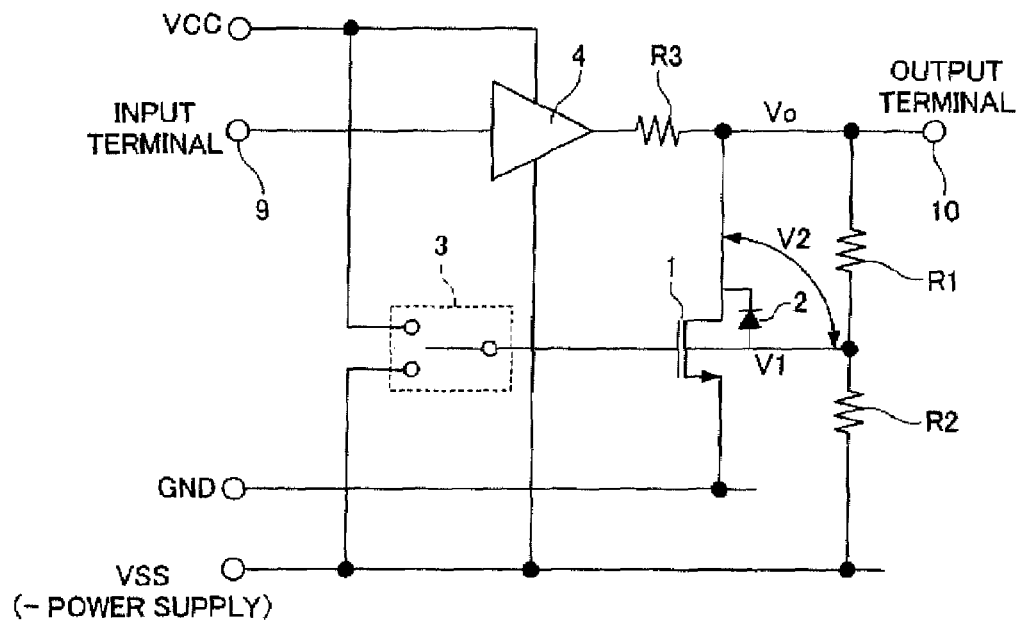
FIG. 1 is a circuit diagram showing a mute circuit according to Embodiment 1 of the present invention.

FIG. 1 is a circuit diagram showing a mute circuit according to Embodiment 1 of the present invention.

As shown in FIG. 1, the mute circuit of Embodiment 1 comprises an Nch (channel) MOS transistor 1 for muting, a mute switch circuit 3, an amplifier 4, a resistor (corresponding to a first resistor) R1, a resistor (corresponding to a second resistor) R2, and a resistor R3. In this mute circuit, a parasitic diode 2 appears between the drain and the back gate of the NchMOS transistor 1.

The amplifier 4 has an input connected to an input terminal 9 and an output connected to an output terminal 10 via the resistor R3, and the amplifier 4 outputs positive and negative signals in a state in which the center level of an output signal Vo is at the level of ground potential GND.

The NchMOS transistor 1 has a drain connected to a junction point between the resistor R3 and the output terminal 10 and a source connected to the ground potential GND.

The mute switch circuit 3 selects one of power supply potential VCC or negative potential VSS and applies the selected potential to the gate of the NchMOS transistor 1 to control on/off of the NchMOS transistor 1.

The resistor R1 and the resistor R2 are connected in series, one end of the resistor R1 is connected to the output terminal 10, a junction point between the resistor R1 and the resistor R2 is connected to the back gate of the NchMOS transistor 1, and the other end of the resistor R2 is connected to negative potential VSS. In other words, the back gate of the NchMOS transistor 1 is biased by a voltage obtained by dividing a voltage difference between the output signal Vo of the output terminal 10 and the predetermined negative potential VSS by the resistance ratio between the resistor R1 and the resistor R2 connected in series. The relative ratio between the resistor R1 and the resistor R2 is about 1:1. The resistance of the resistor R3 is sufficiently small relative to those of the resistors R1 and R2.

The following will discuss the operations of the mute circuit configured thus.

When muting is turned on, the power supply potential VCC is applied to the gate of the NchMOS transistor 1 to turn on the NchMOS transistor 1. When the NchMOS transistor 1 is turned on, the output terminal 10 is short-circuited to the ground potential GND through the ON resistance of the NchMOS transistor 1, so that a signal inputted to the amplifier 4 is muted in accordance with the ratio between the resistor R3 and the ON resistance of the NchMOS transistor 1.

When muting is turned off, the negative potential VSS is applied to the gate of the NchMOS transistor 1 to turn off the NchMOS transistor 1. Since the NchMOS transistor 1 is turned off, the output terminal 10 is not short-circuited to the ground potential GND. Thus the signal inputted to the amplifier 4 is not muted but outputted to the output terminal 10. At this time, since the resistance of the resistor R3 is sufficiently small relative to those of the resistors R1 and R2, the level at which the signal is attenuated in accordance with the ratio between the resistor R3 and the resistors R1 and R2 is almost negligible.

The muting function operates in the above manner.

Figure 2:
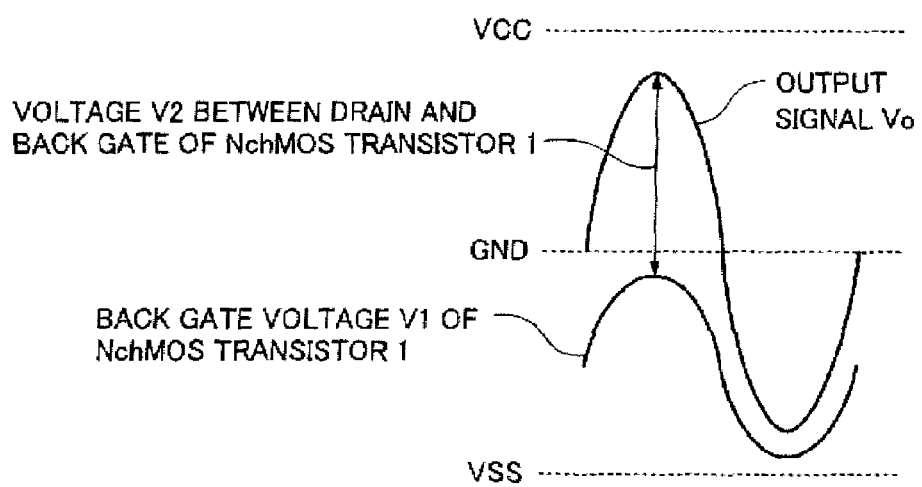
FIG. 2 is a timing chart showing the mute circuit.

FIG. 2 is a timing chart of the output signal Vo and back gate voltage V1 of the NchMOS transistor 1 when muting is turned off. In this case, the back gate of the NchMOS transistor 1 is biased by resistance division between the resistors R1 and R2 which are connected between the output terminal 10 and the negative potential VSS. Thus as shown in FIG. 2, the back gate voltage V1 of the NchMOS transistor 1 changes with the output signal Vo and does not exceeds the output signal Vo. For this reason, the parasitic diode 2 between the drain and the back gate of the NchMOS transistor 1 is not turned on, preventing the clamping of the output signal Vo when muting is turned off.

In this case, the back gate voltage V1 of the NchMOS transistor 1 is expressed by equation (1) below:

$$V1 = Vo - (Vo - VSS)\{R1/(R1+R2)\} \quad (1)$$

Further, a voltage difference V2 between the drain and the back gate of the NchMOS transistor 1 is a voltage difference between the output signal Vo and the back gate voltage V1 of the NchMOS transistor 1, so that the voltage difference V2 is expressed by equation (2) below based on equation (1):

$$V2 = (Vo - VSS)\{R1/(R1+R2)\} \quad (2)$$

For example, when the power supply potential VCC is 3 V, the negative potential VSS is (−3) V, and the resistance ratio between the resistor R1 and the resistor R2 is 1:1, the voltage difference V2 between the drain and the back gate of the NchMOS transistor 1 according to equation (2) is expressed by equation (3) below:

$$V2 = (Vo+3)/2 \quad (3)$$

As is evident from equation (3), the voltage difference V2 between the drain and the back gate of the NchMOS transistor 1 is maximized when the output signal Vo is maximized on the positive side. The maximum value of the output signal Vo on the positive side does not exceed the power supply potential VCC of 3 V, and thus the voltage difference V2 between the drain and the back gate of the NchMOS transistor 1 changes within 3 V. In this way, the voltage difference V2 between the drain and the back gate of the NchMOS transistor 1 does not exceed the power supply potential on the positive side and the negative side. Thus, for example, when the NchMOS transistor 1 has a breakdown voltage of 3 V, the power supply potential VCC of 3V is available. Therefore, the breakdown voltage of the NchMOS transistor 1 for muting only has to be equal to or higher than the power supply potential of the positive side or the negative side, so that it is possible to use a power supply potential equal to the breakdown voltage of the NchMOS transistor 1 for muting.

The relative ratio between the resistor R1 and the resistor R2 is set around 1:1. This is because when the resistor R1 is larger than the resistor R2, the maximum value of the voltage difference V2 between the drain and the back gate of the NchMOS transistor 1 exceeds the power supply potential VCC as indicated by equation (2), the NchMOS transistor 1 requires a breakdown voltage equal to or higher than the power supply potential VCC, and the range of available power supply voltage is reduced. Further, when the resistor R2 is larger than resistor R1, the back gate voltage V1 of the NchMOS transistor 1 may exceed the level of the ground potential GND as indicated by equation (1), so that the parasitic diode between the source and the back gate of the NchMOS transistor 1 is turned on and the output signal is clamped.

As described above, according to Embodiment 1, the clamping of the output signal is prevented when muting is turned off, the maximum value of the voltage difference between the drain and the back gate of the NchMOS transistor 1 can be equal to the power supply potential VCC, expanding the working range of the power supply potential VCC to the breakdown voltage of the NchMOS transistor 1 for muting the output.

Embodiment 2

Figure 3:
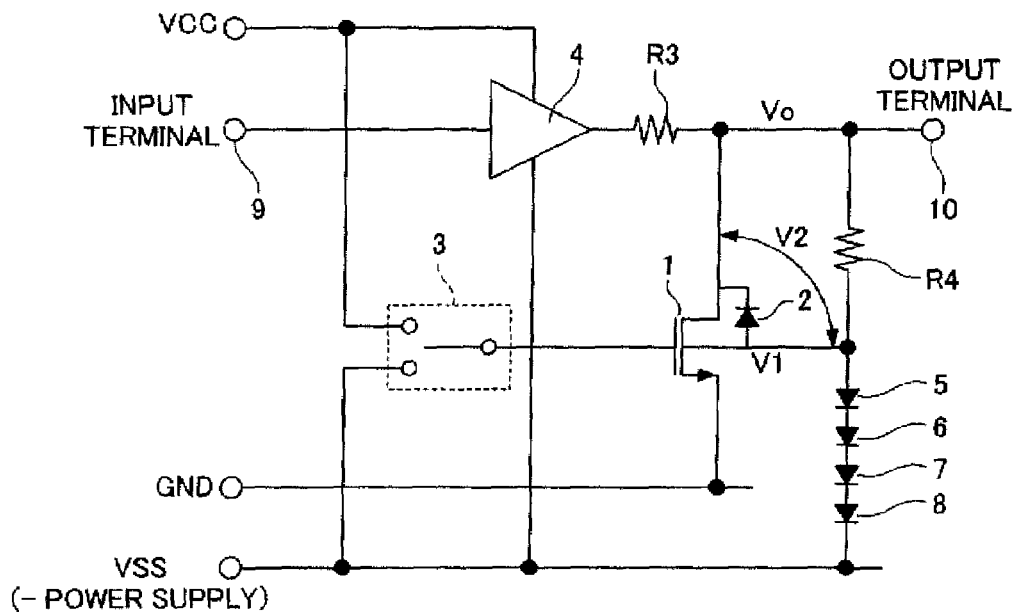
FIG. 3 is a circuit diagram showing a mute circuit according to Embodiment 2 of the present invention.

FIG. 3 is a circuit diagram showing a mute circuit according to Embodiment 2 of the present invention. The same configurations as those of Embodiment 1 of FIG. 1 are indicated by the same reference numerals and the explanation thereof is omitted.

In Embodiment 2, the mute circuit comprises, instead of the resistors R1 and R2 of Embodiment 1, a resistor (corresponding to a first resistor) R4 having one end connected to an output terminal 10 and four diodes (an example of the predetermined number of diodes) 5, 6, 7 and 8 connected in series in the forward direction. The other end of the resistor R4 is connected to the anode side of the diodes 5, 6, 7 and 8, a junction point between the resistor R4 and the diodes 5, 6, 7 and 8 is connected to the back gate of an NchMOS transistor 1, and the cathode side of the diodes 5, 6, 7 and 8 is connected to negative potential VSS.

In this configuration, the back gate of the NchMOS transistor 1 for muting an output signal Vo is connected to the negative potential VSS via the diodes 5, 6, 7 and 8 connected in series in the forward direction, and connected to the output terminal 10 via the resistor R4.

The following will discuss the operations of the mute circuit according to Embodiment 2. The operations of a muting function are similar to those of Embodiment 1 and thus the detailed explanation thereof is omitted.

Figure 4:
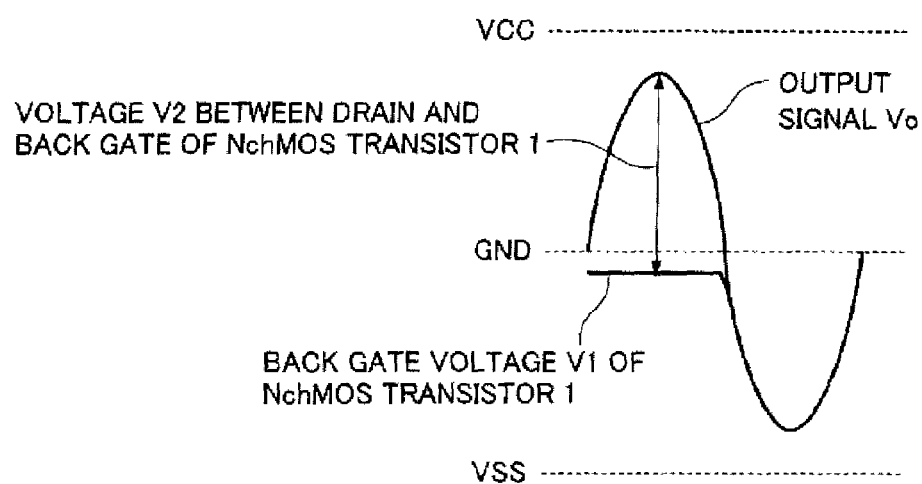
FIG. 4 is a timing chart showing the mute circuit.

FIG. 4 is a timing chart of the output signal Vo and back gate voltage V1 of the NchMOS transistor 1 when muting is turned off. As shown in FIG. 4, when the output signal Vo is outputted to the positive side, the back gate voltage V1 of the NchMOS transistor 1 is limited by turning on all the diodes 5 to 8. The back gate voltage V1 is expressed by equation (4) below:

$$V1 = V5 + V6 + V7 + V8 + VSS \quad (4)$$

where V5, V6, V7, and V8 represent voltages at which the diodes 5, 6, 7 and 8 are turned on.

When the output signal Vo is outputted to the negative side, the back gate voltage V1 of the NchMOS transistor 1 is not limited by the diodes 5 to 8 and thus changes like the output signal Vo. In this way, the back gate voltage V1 of the NchMOS transistor 1 changes with the output signal Vo without exceeding the output signal Vo. It is thus possible to prevent the clamping of the output signal Vo as in Embodiment 1.

Further, a voltage difference V2 between the drain and the back gate of the NchMOS transistor 1 is a voltage difference between the output signal Vo and the back gate voltage V1 of the NchMOS transistor 1, so that the voltage difference V2 is almost 0 V when the output signal Vo is outputted to the negative side. When the output signal Vo is outputted to the positive side, the voltage difference V2 is expressed by equation (5) below based on equation (4):

$$V2 = Vo - (V5 + V6 + V7 + V8 + VSS) \quad (5)$$

For example, when the power supply potential VCC is 3 V, the negative potential VSS is (−3) V, and the voltages V5 to V8 at which the diodes 5 to 8 are turned on are 0.7 V, the maximum output signal Vo on the positive side maximizes the voltage difference V2 between the drain and the back gate of the NchMOS transistor 1 as indicated by equation (5). The maximum value of the output signal Vo on the positive side does not exceed the power supply potential VCC of 3 V, and thus the voltage difference V2 between the drain and the back gate of the NchMOS transistor 1 changes within 3.2 V. In this way, the maximum value of the voltage difference V2 between the drain and the back gate of the NchMOS transistor 1 is almost equal to the power supply potential of the positive side and the negative side. Thus, it is possible to use a power supply voltage equal to the breakdown voltage of the NchMOS transistor 1.

The same effect can be obtained by connecting a predetermined number of diodes between GND and the back gate of the NchMOS transistor 1 according to the negative potential VSS such that the back gate voltage V1 of the NchMOS transistor 1 is set around 0 V when the output signal Vo is outputted to the positive side.

As described above, according to Embodiment 2, the clamping of the output signal is prevented as in Embodiment 1 when muting is turned off, and the operating range of the power supply potential VCC can be expanded to the breakdown voltage of the NchMOS transistor 1 for muting the output.

Embodiment 3

Figure 5:
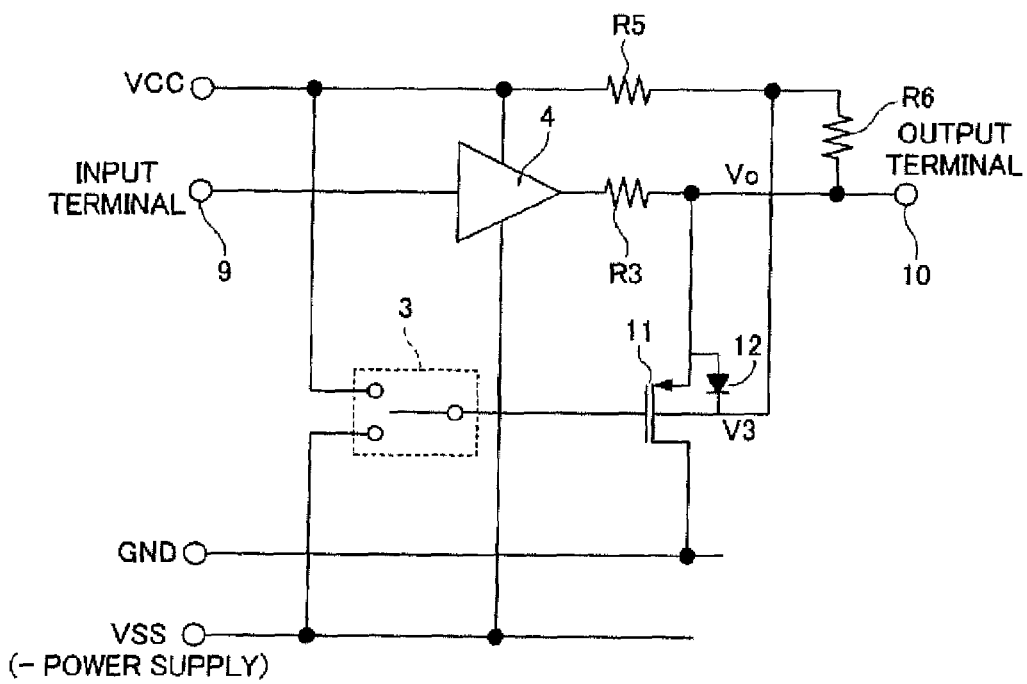
FIG. 5 is a circuit diagram showing a mute circuit according to Embodiment 3 of the present invention.

FIG. 5 is a circuit diagram showing a mute circuit according to Embodiment 3 of the present invention. The same configurations as those of Embodiment 1 of FIG. 1 are indicated by the same reference numerals and the explanation thereof is omitted.

In Embodiment 3, the mute circuit comprises, instead of the NchMOS transistor 1 of Embodiment 1, a PchMOS transistor 11 as a MOS transistor for muting with a switching muting function. The source of the PchMOS transistor 11 is connected to an output terminal 10, the drain of the PchMOS transistor 11 is connected to ground potential GND, and power supply potential VCC or negative potential VSS which has been selected by a mute switch circuit 3 is applied to the gate of the PchMOS transistor 11. In the mute circuit, a parasitic diode 12 appears between the source and the back gate of the PchMOS transistor 11.

A resistor (corresponding to a first resistor) R5 and a resistor (corresponding to a second resistor) R6 are connected in series between power supply potential VCC and the output terminal 10, the back gate of the PchMOS transistor 11 is connected to a junction point between the resistor R5 and the resistor R6, and the back gate of the PchMOS transistor 11 is biased by resistance division between the resistor R5 and the resistor R6. The relative ratio between the resistor R5 and the resistor R6 is about 1:1.

The following will discuss the operations of the mute circuit according to Embodiment 3.

When muting is turned on, the negative potential VSS is applied to the gate of the PchMOS transistor 11 to turn on the PchMOS transistor 11. When the PchMOS transistor 11 is turned on, the output terminal 10 is short-circuited to the ground potential GND through the ON resistance of the PchMOS transistor 11, so that a signal inputted to an amplifier 4 is muted in accordance with the ratio between the resistor R3 and the ON resistance of the PchMOS transistor 11.

When muting is turned off, the power supply potential VCC is applied to the gate of the PchMOS transistor 11 to turn off the PchMOS transistor 11. Since the PchMOS transistor 11 is turned off, the output terminal 10 is not short-circuited to the ground potential GND. Thus the signal inputted to the amplifier 4 is not muted but outputted to the output terminal 10. At this time, since the resistance of the resistor R3 is sufficiently small relative to those of the resistors R5 and R6, the level at which the signal is attenuated in accordance with the ratio between the resistor R3 and the resistors R5 and R6 is almost negligible.

The muting function operates in the above manner.

Figure 6:
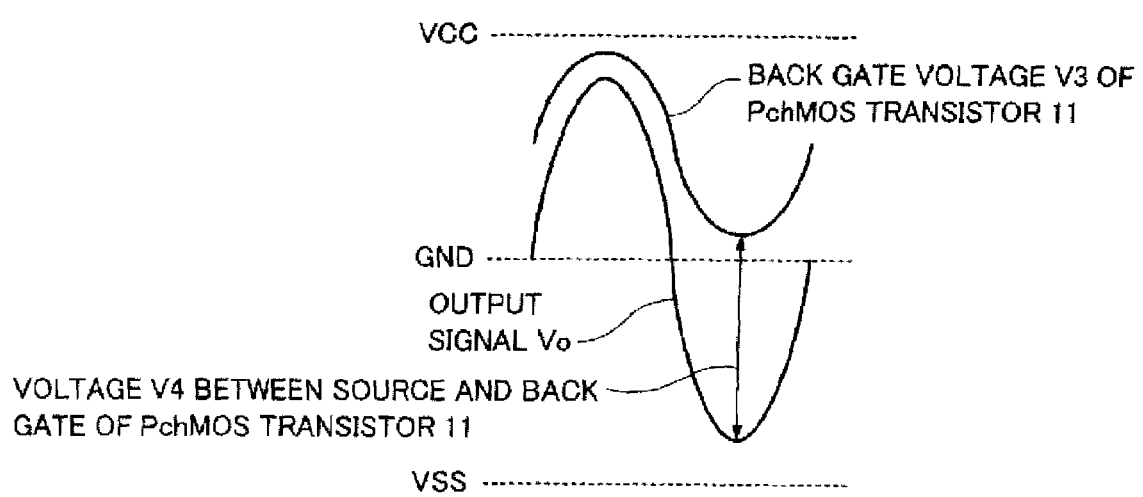
FIG. 6 is a timing chart showing the mute circuit.

FIG. 6 is a timing chart of an output signal Vo and a back gate voltage V3 of the PchMOS transistor 11 when muting is turned off. As shown in FIG. 6, the back gate voltage V3 of the PchMOS transistor 11 changes with the output signal Vo. As described above, the back gate voltage V3 of the PchMOS transistor 11 does not fall below the output signal Vo, so that a parasitic diode 12 between the source and the back gate of the PchMOS transistor 11 is not turned on and the clamping of the output signal Vo is prevented when muting is turned off. Further, as in Embodiment 1, a voltage difference V4 between the source and the back gate of the PchMOS transistor 11 for muting changes within the power supply voltage of the positive side and the negative side. It is thus possible to use a power supply voltage equal to the breakdown voltage of the PchMOS transistor 11 for muting.

The relative ratio between the resistor R5 and the resistor R6 is set around 1:1 as in Embodiment 1 where the relative ratio between the resistor R1 and the resistor R2 is set around 1:1.

As described above, according to Embodiment 3, the clamping of the output signal is prevented as in Embodiment 1 when muting is turned off, and the operating range of the power supply potential VCC can be expanded to the breakdown voltage of the MOS transistor for muting the output.

Embodiment 4

Figure 7:
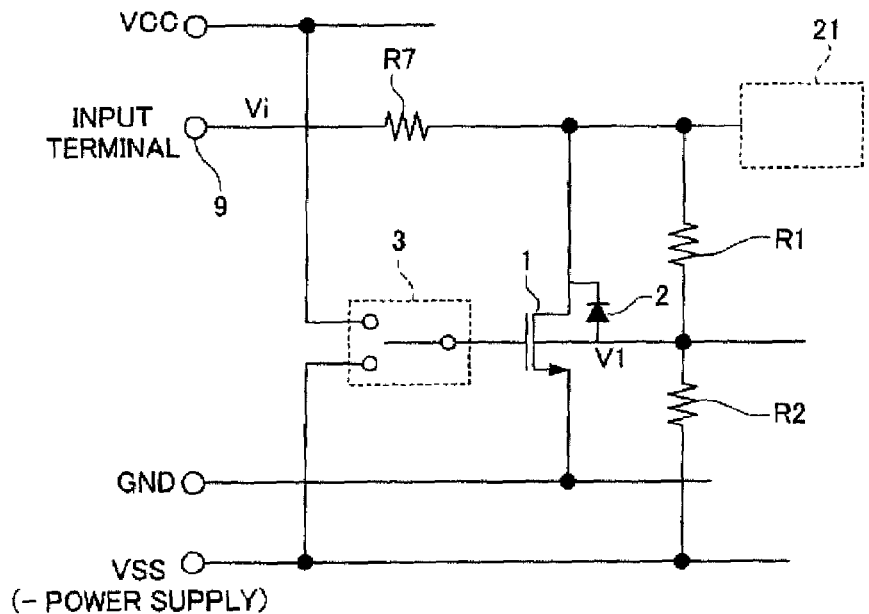
FIG. 7 is a circuit diagram showing a mute circuit according to Embodiment 4 of the present invention.

FIG. 7 is a circuit diagram showing a mute circuit according to Embodiment 4 of the present invention. The same configurations as those of Embodiment 1 of FIG. 1 are indicated by the same reference numerals and the explanation thereof is omitted.

In Embodiment 4, the amplifier 4 is omitted, one end of a resistor (corresponding to a first resistor) R7 is connected to an input terminal 9, and a signal inputted from the input terminal 9 is inputted to an internal circuit 21 through the resistor R7. The drain of an NchMOS transistor 1 is connected to the other end of the resistor R7 and connected to the input terminal 9 via the resistor R7. The resistance of the resistor R7 is sufficiently small relative to those of a resistor (corresponding to a second resistor) R1 and a resistor (corresponding to a third resistor) R2.

The following will discuss the operations of the mute circuit according to Embodiment 4.

In FIG. 7, when muting is turned on, the signal inputted to the input terminal 9 is muted in accordance with the ratio between the resistor R7 and the ON resistance of the NchMOS transistor 1 in response to the turn-on of the NchMOS transistor 1. Further, when muting is turned off, the signal inputted to the input terminal 9 is not muted in response to the turn-off of the NchMOS transistor 1 but inputted to the internal circuit 21. At this time, since the resistance of the resistor R7 is sufficiently small relative to those of the resistors R1 and R2, the level at which the signal is attenuated in accordance with the ratio between the resistor R7 and the resistors R1 and R2 is almost negligible.

The muting function operates in the above manner.

Figure 8:
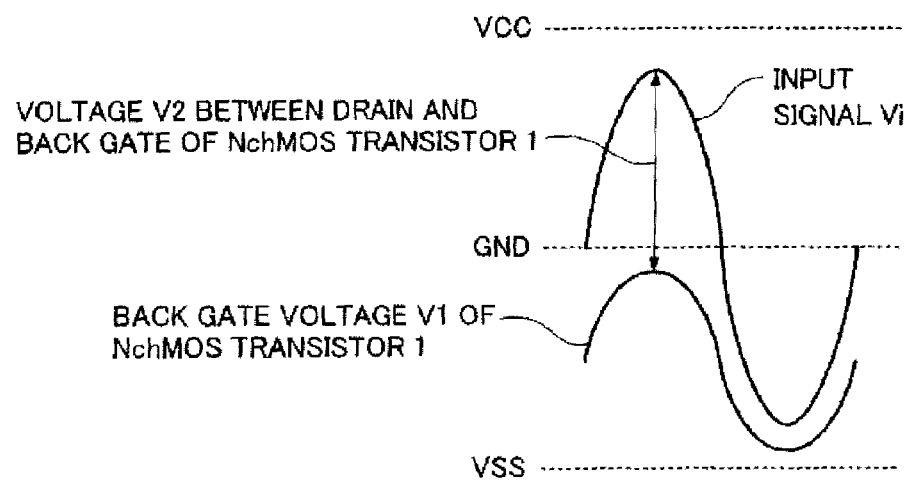
FIG. 8 is a timing chart showing the mute circuit.

FIG. 8 is a timing chart of an input signal Vi and a back gate voltage V1 of the NchMOS transistor 1 when muting is turned off. As shown in FIG. 8, the back gate voltage V1 of the NchMOS transistor 1 changes with the input signal Vi without exceeding the input signal Vi. For this reason, a parasitic diode 2 between the drain and the back gate of the NchMOS transistor 1 is not turned on, preventing the clamping of the input signal Vi when muting is turned off. Further, as in Embodiment 1, a voltage difference V2 between the source and the back gate of the NchMOS transistor 1 for muting changes within the power supply potential of the positive side and the negative side. It is thus possible to use a power supply voltage equal to the breakdown voltage of the NchMOS transistor 1 for muting.

The relative ratio between the resistor R1 and the resistor R2 is set around 1:1 as in Embodiment 1.

As described above, according to Embodiment 4, the clamping of the input signal can be prevented when muting is turned off, and the operating range of power supply voltage VCC can be expanded to the breakdown voltage of the MOS transistor for muting the input.

The mute circuit of the present invention is useful for a switch circuit for muting or the like, in which the clamping of input/output signals is prevented by using a MOS transistor as a switching device for muting input and output or the like in an input/output interface.

What is claimed is:

1. A mute circuit for muting positive and negative output signals outputted to an output terminal, the mute circuit comprising:
    an NchMOS transistor having a drain connected to the output terminal and a source connected to a ground potential; a mute switch circuit for controlling on/off of the NchMOS transistor by switching a gate voltage of the NchMOS transistor to a power supply potential or a negative potential;
    a resistor having one end connected to the output terminal; and
    a predetermined number of diodes connected in series in a forward direction, wherein a junction point between an other end of the resistor and an anode side of the diodes is connected to a back gate of the NchMOS transistor, and a cathode side of the diodes is connected to the negative potential.

2. A mute circuit for muting positive and negative output signals outputted to an output terminal, comprising:
    an NchMOS transistor having a drain connected to the output terminal and a source connected to a ground potential; and
    a mute switch circuit for controlling on/off of the NchMOS transistor by switching a gate voltage of the NchMOS transistor to a power supply potential or negative potential;
    wherein a back gate voltage of the NchMOS transistor changes in accordance with a divided voltage of the output signals while the NchMOS transistor is off.

3. The mute circuit according to claim 2, furthermore comprising:
    a resistor having one end connected to the output terminal; and
    a predetermined number of diodes connected in series in a forward direction,
    wherein junction point between an other end of the resistor and an anode side of the diodes is connected to a back gate of the NchMOS transistor, and a cathode side of the diodes is connected to the negative potential.

* * * * *